(12) United States Patent
Mun et al.

(10) Patent No.: US 11,398,420 B2
(45) Date of Patent: Jul. 26, 2022

(54) SEMICONDUCTOR PACKAGE HAVING CORE MEMBER AND REDISTRIBUTION SUBSTRATE

(71) Applicant: SAMSUNG ELECTRONICS CO., LTD., Suwon-si (KR)

(72) Inventors: Kyungdon Mun, Hwaseong-si (KR); Myungsam Kang, Hwaseong-si (KR); Youngchan Ko, Seoul (KR); Yieok Kwon, Hwaseong-si (KR); Jeongseok Kim, Cheonan-si (KR); Gongje Lee, Seoul (KR); Bongju Cho, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/031,141

(22) Filed: Sep. 24, 2020

(65) Prior Publication Data
US 2021/0265251 A1  Aug. 26, 2021

(30) Foreign Application Priority Data
Feb. 20, 2020 (KR) ........................ 10-2020-0021231

(51) Int. Cl.
*H01L 23/498* (2006.01)
*H01L 23/31* (2006.01)
*H01L 23/00* (2006.01)

(52) U.S. Cl.
CPC .... *H01L 23/49822* (2013.01); *H01L 23/3128* (2013.01); *H01L 23/49816* (2013.01); *H01L 24/05* (2013.01)

(58) Field of Classification Search
CPC ........... H01L 23/49822; H01L 23/3128; H01L 23/49816; H01L 24/05; H01L 24/18; H01L 21/561; H01L 23/16; H01L 23/562; H01L 23/3142; H01L 23/3121; H01L 23/49838; H01L 23/13; H01L 23/31; H01L 23/34;
(Continued)

(56) References Cited

U.S. PATENT DOCUMENTS

| | | |
|---|---|---|
| 8,975,732 B2 | 3/2015 | Tojo et al. |
| 9,929,100 B2* | 3/2018 | Lee ........................ H01L 24/96 |
| 10,170,386 B2* | 1/2019 | Kang .................. H01L 23/5389 |

(Continued)

FOREIGN PATENT DOCUMENTS

WO    WO-2020176559 A1 *  9/2020  ............. H01L 25/50

*Primary Examiner* — Mamadou L Diallo
(74) *Attorney, Agent, or Firm* — Lee IP Law, PC

(57) ABSTRACT

A semiconductor package includes a core member having a first surface and a second surface opposing each other, and an external side surface between the first and second surfaces, the core member having a through-hole connecting the first and second surfaces, having a protruding portion that protrudes from the external side surface, and having a surface roughness (Ra) of 0.5 μm or more, a redistribution substrate on the first surface of the core member, and including a redistribution layer; a semiconductor chip in the through-hole on the redistribution substrate, and having a contact pad electrically connected to the redistribution layer, and an encapsulant on the redistribution substrate, and covering the semiconductor chip and the core member, the protruding portion of the core member having a surface exposed to a side surface of the encapsulant.

20 Claims, 17 Drawing Sheets

(58) Field of Classification Search
CPC .... H01L 23/481; H01L 23/49827; H01L 23/525
See application file for complete search history.

(56) References Cited

U.S. PATENT DOCUMENTS

| | | |
|---|---|---|
| 2008/0138938 A1 | 6/2008 | Wenzel et al. |
| 2013/0113091 A1 | 5/2013 | Meng et al. |
| 2013/0320530 A1 | 12/2013 | Koey et al. |
| 2014/0070396 A1* | 3/2014 | Kyozuka .............. H01L 24/24 257/698 |
| 2016/0336249 A1* | 11/2016 | Kang .................. H01L 23/552 |
| 2017/0352626 A1 | 12/2017 | Lin et al. |
| 2018/0294202 A1* | 10/2018 | Cheng ................ H01L 23/564 |
| 2021/0193562 A1* | 6/2021 | Lee ...................... H05K 3/36 |
| 2021/0272888 A1* | 9/2021 | Tsai ................ H01L 23/49822 |

\* cited by examiner

I1-I1'

I2-I2'

SEMICONDUCTOR PACKAGE HAVING CORE MEMBER AND REDISTRIBUTION SUBSTRATE

CROSS-REFERENCE TO RELATED APPLICATION

Korean Patent Application No. 10-2020-0021231, filed on Feb. 20, 2020, in the Korean Intellectual Property Office, and entitled: "Semiconductor Package," is incorporated by reference herein in its entirety.

BACKGROUND

1. Field

Embodiments relate to a semiconductor package.

2. Description of the Related Art

Recently, interest in semiconductor packages having improved rigidity and heat dissipation characteristics has increased with high performance in semiconductor chips.

SUMMARY

Embodiments are directed to a semiconductor package, including: a core member having a first surface and a second surface opposing each other, and an external side surface between the first and second surfaces, the core member having a through-hole connecting the first and second surfaces, having a protruding portion that protrudes from the external side surface, and having a surface roughness (Ra) of 0.5 µm or more; a redistribution substrate on the first surface of the core member, and including a redistribution layer; a semiconductor chip in the through-hole on the redistribution substrate, and having a contact pad electrically connected to the redistribution layer; and an encapsulant on the redistribution substrate, and covering the semiconductor chip and the core member, the protruding portion of the core member having a surface exposed to a side surface of the encapsulant.

Example embodiments are also directed to a semiconductor package, including a redistribution substrate including a redistribution layer; a semiconductor chip on the redistribution substrate, and having a contact pad electrically connected to the redistribution layer; a core member on the redistribution substrate, the core member having a protruding portion that protrudes from an external side surface and having a through-hole accommodating the semiconductor chip, wherein an area defined by the external side surface is smaller than an area of the redistribution substrate; and an encapsulant on the redistribution substrate, covering the semiconductor chip and the core member, and having a side surface to which a surface of the protruding portion is exposed.

Example embodiments are also directed to a semiconductor package, including: a redistribution substrate having a first surface and a second surface opposing each other, and including an insulating member and a redistribution layer on the insulating member, the redistribution layer having a plurality of redistribution patterns that are respectively disposed on a plurality of levels of the insulating member, and having a plurality of redistribution vias that are respectively connected to the plurality of redistribution patterns; a core member on the first surface of the redistribution substrate, the core member having a metal frame that includes a through-hole and an external side surface that has a protruding portion, and having a plating layer having a surface roughness (Ra) of 0.5 µm or more on a surface of the metal frame, an area of the core member surrounded by the external side surface of the core member being smaller than an area of the redistribution substrate; a semiconductor chip on the first surface of the redistribution substrate in the through-hole, and having a contact pad electrically connected to the redistribution layer by a redistribution via, adjacent to the first surface of the redistribution substrate; an encapsulant on the first surface of the redistribution substrate, covering the semiconductor chip and the core member, the encapsulant including an insulating resin that is different from the insulating resin of the insulating member, and having a side surface to which a surface of the protruding portion is exposed; and an underbump metal on the second surface of the redistribution substrate, and electrically connected to the redistribution layer. The protruding portion may have an upper surface extending from the upper surface of the core member to be flat and a lower surface recessed from the lower surface of the core member.

BRIEF DESCRIPTION OF DRAWINGS

Features will become apparent to those of skill in the art by describing in detail example embodiments with reference to the attached drawings in which.

DETAILED DESCRIPTION

Figure 1:
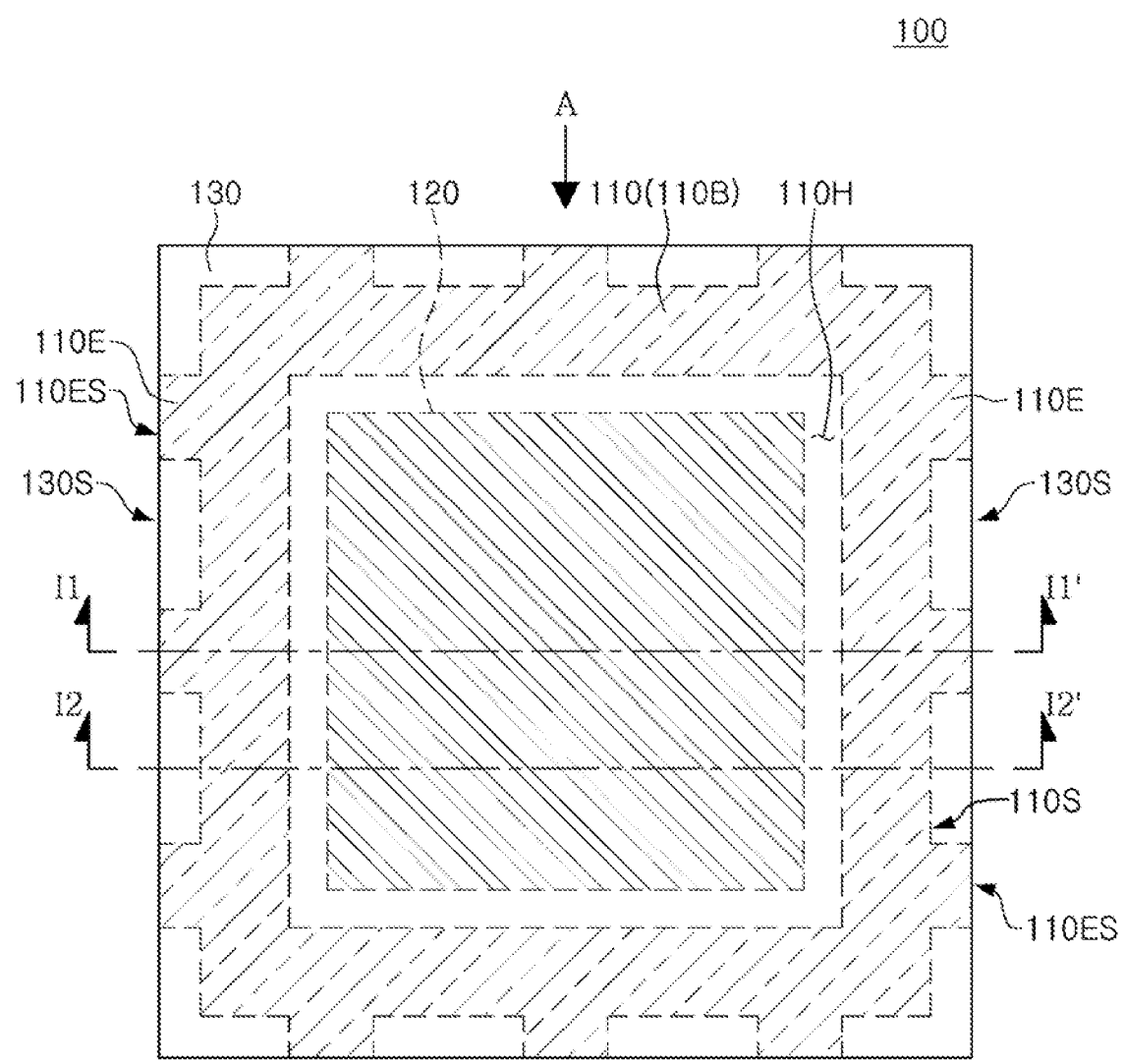
FIG. 1 is a plan view illustrating a semiconductor package according to an example embodiment.
Figure 2A:
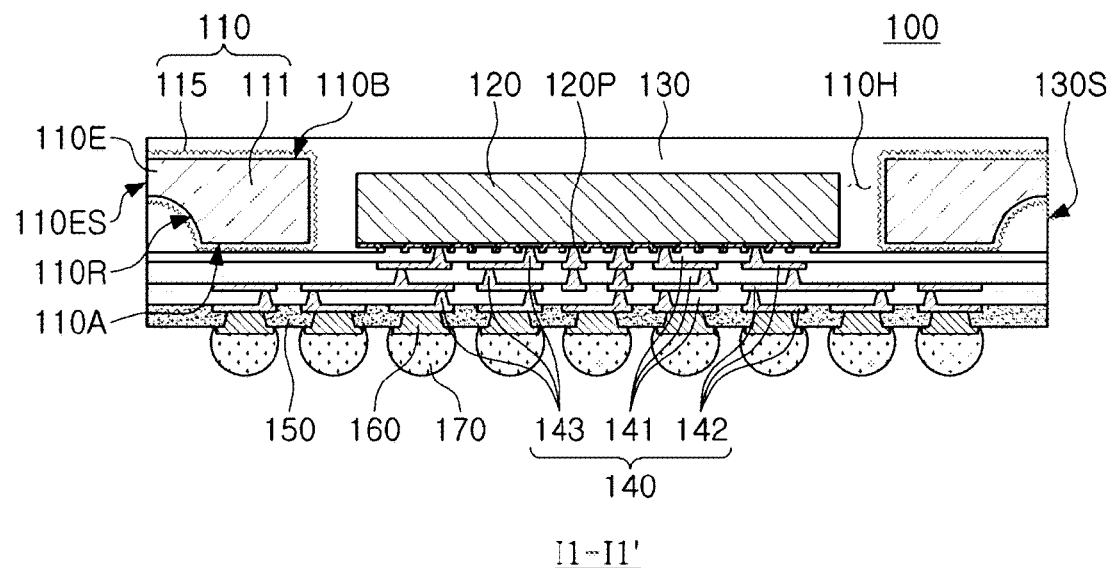
FIGS. 2A to 2B are side cross-sectional views of the semiconductor package of FIG. 1, along sections I1-I1' and I2-I2', respectively.
Figure 2B:
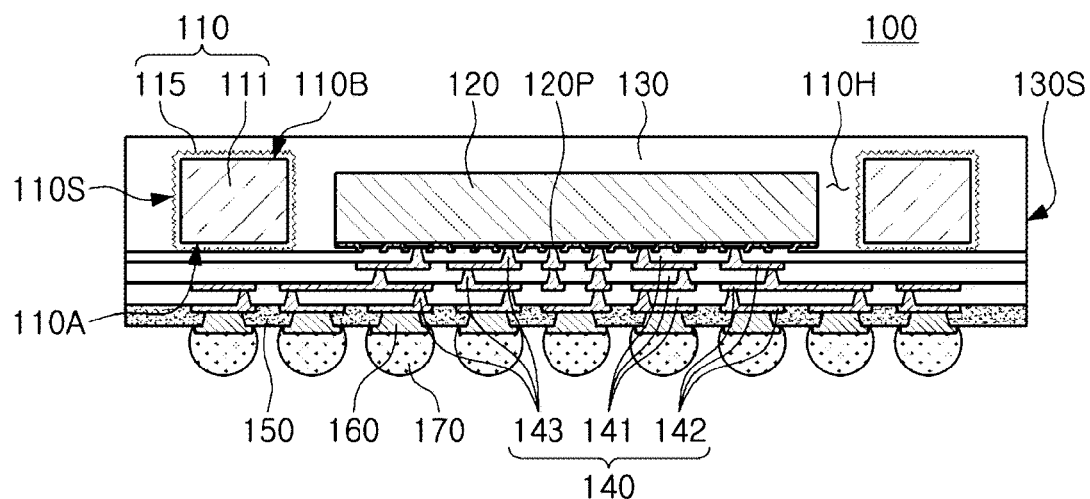

FIG. 1 is a plan view illustrating a semiconductor package according to an example embodiment, and FIGS. 2A to 2B are side cross-sectional views of the semiconductor package of FIG. 1, along sections I1-I1' and I2-I2', respectively.

Referring to FIGS. 1, 2A, and 2B, a semiconductor package 100 according to the present example embodiment may include a core member 110 having a first surface 110A and a second surface 110B, located opposite to each other, and an external side surface 110ES forming a side between the first and second surfaces. The semiconductor package 100 may further include a redistribution substrate 140 disposed on the first surface 110A of the core member 110, a semiconductor chip 120 disposed in the through-hole 110H on the redistribution substrate 140, and an encapsulant 130 disposed on the redistribution substrate 140, and covering the semiconductor chip 120 and the core member 110.

The redistribution substrate 140 may include an insulating member 141 and redistribution layers 142 disposed on the insulating member 141. The semiconductor chip 120 disposed on the redistribution substrate 140 may include a contact pad 120P electrically connected to the redistribution layers 142.

In the present example embodiment, the insulating member 141 may include a plurality of (for example, three) insulating layers, the redistribution layers 142 may include a plurality of (for example, three) redistribution layers 142 disposed on the plurality of insulating layers, respectively, and a redistribution via 143 penetrating the plurality of insulating layers and connecting adjacent redistribution layers 142. The structure of the redistribution substrate 140 may be formed of different layers in some example embodiments.

In the present example embodiment, the plurality of insulating layers constituting the insulating member 141 may include a thermosetting resin such as an epoxy resin, a thermoplastic resin such as polyimide, etc. In an example embodiment, the plurality of insulating layers may use a photo imagable dielectric (PID) resin. The redistribution layers 142 may serve to redistribute the contact pad 120P of the semiconductor chip 120. The redistribution layers 142 may include, for example, a conductive material such as copper (Cu), aluminum (Al), silver (Ag), tin (Sn), gold (Au), nickel (Ni), lead (Pb), titanium (Ti), or alloys thereof. The redistribution via 143 may be a filled-type via, or a conformal-type via in which the conductive material is formed to be conformal along a wall surface of a hole. In an example embodiment, the redistribution via 143 may have a tapered shape in the same direction with each other, for example, a tapered shape with an upper width that is greater than a lower width based on a cross-section. When formed by the same plating process, the redistribution via 143 may be integrally formed with the redistribution layer 142.

In the present example embodiment, the core member 110 may include a metal frame 111 and a plating layer 115 on a surface of the metal frame 111.

A main body of the core member 110 may be composed of the metal frame 111, which may provide a higher coefficient of thermal transfer (CTE) and superior rigidity relative to a general core member composed of an organic material (for example, a printed circuit board (PCB)). Therefore, the heat dissipation performance of the semiconductor package 100 may be greatly improved, and warpage thereof may be advantageously reduced. In addition, the core member 110 may be manufactured in a relatively simplified process compared to a core member in formed of a PCB.

The plating layer 115 may have a predetermined surface roughness. In an example embodiment, the surface roughness (Ra) of the plating layer 115 may be 0.5 μm or more. The core member 110 may have a rough surface from the plating layer 115, and thus adhesion to the encapsulant 130 may be enhanced. The surface roughness of the core member 110 and the encapsulant, which are heterogeneous materials, may effectively reduce a peeling problem stemming from a difference in coefficients of thermal expansion. In an example embodiment, the peel strength of the core member 110 and the encapsulant 130 may be 0.4 kgf/cm or more. In an example embodiment, the metal frame 111 may include metal such as copper (Cu) or a Fe—Ni alloy. The plating layer 115 may include a copper plating layer.

The core member 110 may include a protruding portion 110E having a surface 110ES that is exposed at the side surface 130S of the encapsulant 130. As illustrated in FIGS. 1 and 2A, the protruding portion 110E may have a structure protruding from at least one external side surface 110S of the core member 110. In a process of forming a plurality of the metal frames 111, the protruding portion 110E may be a structure formed by a remaining portion of a connection line CL that connected adjacent metal frames 111 to each other, the protruding portion 110E being formed in a singulation process such as a cutting process (see FIG. 8D).

Figure 3:
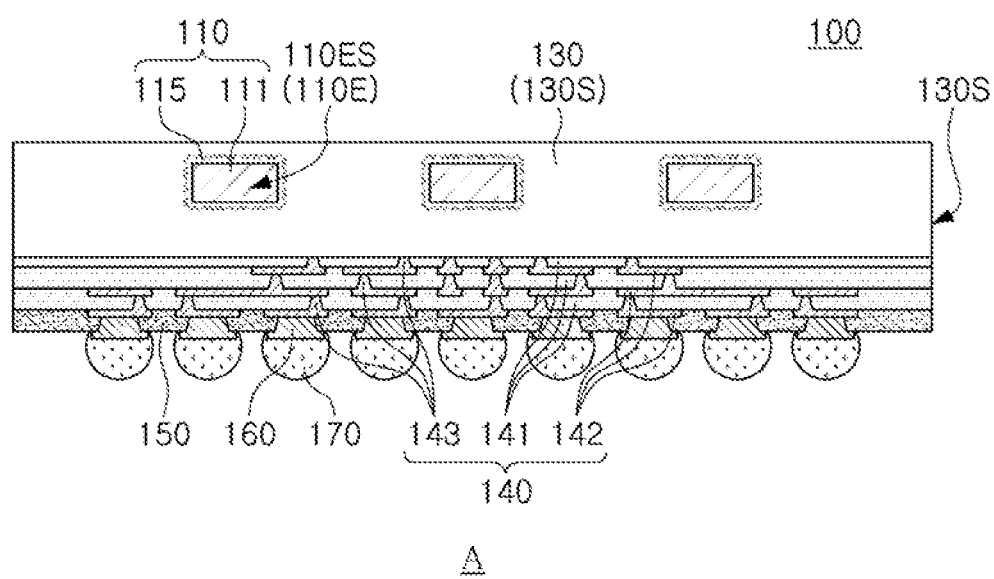
FIG. 3 is an external side surface view illustrating the semiconductor package of FIG. 1.

In an example embodiment, one or more protruding portions 110E may be disposed along each of the external side surfaces 110S of the core member 110. In an example embodiment, the semiconductor package 100 may have a rectangular shape with right angles from a plan view, and the core member 110 may have four external side surfaces 110S. The protruding portion 110E may be disposed in a number of one or more on each of the four external side surfaces 110S. As illustrated in FIGS. 1 and 3, the protruding portions 110E in the present example embodiment may be disposed in plural at regular intervals on each of the four external side surfaces 110S.

FIG. 3 is an external side surface view illustrating the semiconductor package 100 of FIG. 1.

Referring to FIG. 2A and FIG. 3, the exposed surface 110ES of the protruding portion 110E may be a surface obtained by a singulation process. As illustrated in FIG. 2A, the exposed surface 110ES may be substantially coplanar with the side surface 130S of the encapsulant 130. The plating layer 115 may not be disposed on the exposed surface 110ES, which may be provided by the surface of the metal frame 111. In the present example embodiment, the plating layer 115 may be provided on surfaces of the metal frame 111 except for the exposed surface 110ES. Thus, the plating layer 115 may also be provided on an inner side surface of the through-hole 110H and an external side surface except for the exposed surface 110ES. In an example embodiment, the exposed surface of the protruding portion may have such a surface when there is no additional plating process after the singulation process.

As shown in FIG. 2A, the protruding portion 110E may have a flat upper surface extending from the second surface 110B of the core member 110. The protruding portion 110E may have a lower surface 110R that is recessed from the first surface 110A of the core member 110. In an example embodiment, the shape of the protruding portion 110E may formed by an etching process that is applied only to the first surface 110A, without etching the second surface 110B (see FIG. 5B), unlike the process of forming the through-hole 110H. The recessed lower surface 110R of the protruding portion 110E may have a concavely curved surface.

As described above, the core member 110 includes the metal frame 111. Thus, the heat dissipation performance and warpage of the semiconductor package 100 may be improved. The core member 110 may also include the plating layer 115 having a predetermined surface roughness and located a surfaces that are in contact with the encapsulant, which greatly improve the peeling strength. The core member 110 may have the greater thickness than the thickness of the semiconductor chip 120.

The semiconductor chip 120 employed in the present example embodiment may include a processor chip such as a central processor (for example, a central processing unit (CPU)), a graphics processor (for example, a graphics processing unit (GPU)), a field programmable gate array (FPGA), a digital signal processor, a cryptographic processor, a microprocessor, a microcontroller, and the like; for example, an application processor (AP). The semiconductor chip 120 may include a memory chip such as a volatile memory (for example, a DRAM), a non-volatile memory (for example, a ROM), a flash memory, or the like, or a logic chip such as an analog-digital converter, an application-specific IC (ASIC), and the like, or a power management IC (PMIC).

The encapsulant 130 may protect the semiconductor chip 120 disposed in the through-hole 110H of the core member 110. The encapsulant may be disposed on the redistribution substrate 140 to surround at least a portion of each of the core member 110 and the semiconductor chip 120. As illustrated in FIGS. 2A and 2B, the encapsulant 130 may cover the core member 110 and an inactive surface (a surface on which the contact pad 120P is not formed) of the semiconductor chip 120, and may fill at least a portion of the through-hole 110H.

In an example embodiment, the encapsulant 130 may include a thermosetting resin such as an epoxy resin or a thermoplastic resin such as polyimide. In an example embodiment, the encapsulant 130 may include a curable resin such as Ajinomoto Build-up Film (ABF), FR-4, BT, or a photosensitive insulating (PIE) resin.

The semiconductor package 100 according to the present example embodiment may include a passivation layer 150, an underbump metal layer 160, and an electrical connection metal 170.

The passivation layer 150 may protect the redistribution substrate 140 from external physical and chemical damage. The passivation layer 150 may include the above-described insulating material. In an example embodiment, the passivation layer 150 may include ABF, FR-4, BT, solder resist, or PID. The passivation layer 150 may have an opening for exposing a portion of an outermost redistribution layer 142 (for example, a contact pad).

The underbump metal layer 160 may be formed by a suitable metallization method using a suitable conductive material, such as metal, in the opening of the passivation layer 150. The number, an interval, a disposition form, and the like, of the electrical connection metals 170 may be modified depending on design particulars. The electrical connection metal 170 may physically and/or electrically connect the semiconductor package 100 to an external device such as a mainboard of the electronic device. The electrical connection metal 170 may include a low-melting point metal, for example, a solder such as tin (Sn)-aluminum (Al)-copper (Cu), or the like. The electrical connection metal 170 may be a multi-layer or a single layer.

In the present example embodiment, the electrical connection metal 170 is illustrated in a ball shape, but may be another structure, for example, a structure having a constant height, such as a land or a pin.

At least one of the electrical connection metals 170 may be disposed in a fan-out region, that is, a region outside of a region overlapped with the semiconductor chip 120. The fan-out package may be superior to the fan-in package in terms of reliability, and may be implemented with multiple I/O terminals.

Although not illustrated in FIGS. 1 to 3, other semiconductor chips performing the same or different functions may be additionally disposed in the through-hole 110H. In an example embodiment, a separate passive component, such as an inductor, a capacitor, or the like may be disposed in the through-hole 110H. In addition, in another example embodiment, a plurality of through-holes 110H may be formed, and a semiconductor chip 120 and/or passive components may be disposed in each through-hole 110H.

FIGS. 4A, 5A, 6A, and 7A are plan views of main processes for describing a core member forming process in a method of manufacturing a semiconductor package according to an embodiment. FIGS. 4B, 5B, 6B, and 7B are cross-sectional views of a metal frame (or a frame array) of FIGS. 4A, 5A, 6A, and 7A, respectively, along section II1-II1'. FIGS. 4C, 5C, 6C, and 7C are cross-sectional views of a metal frame (or a frame array) of FIGS. 4A, 5A, 6A, and 7A, respectively, along section II2-II2'.

Figure 4A:
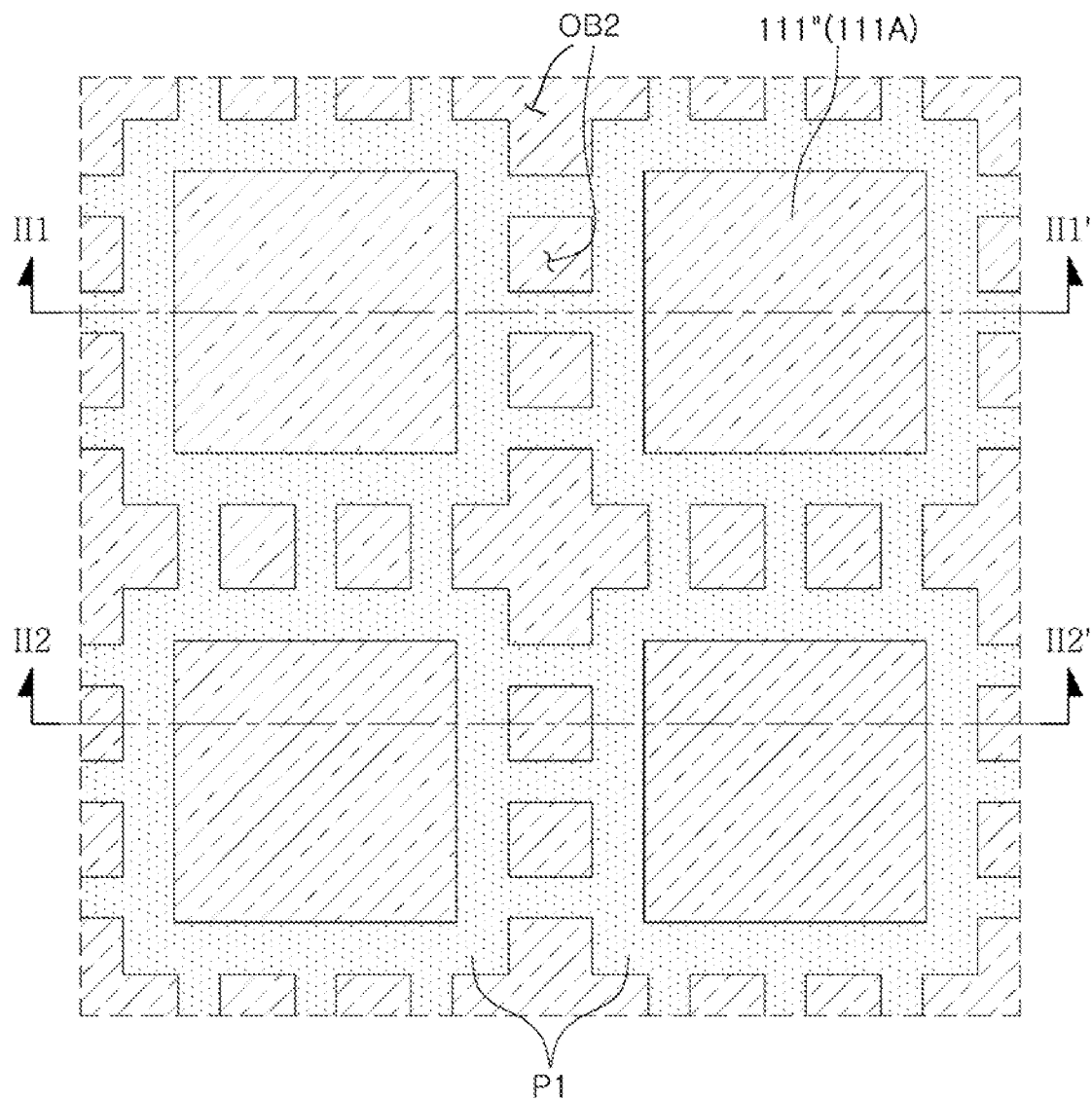
FIGS. 4A, 5A, 6A, and 7A are plan views of main processes for describing a process of forming a core member in a method of manufacturing a semiconductor package according to an example embodiment.
Figure 4B:
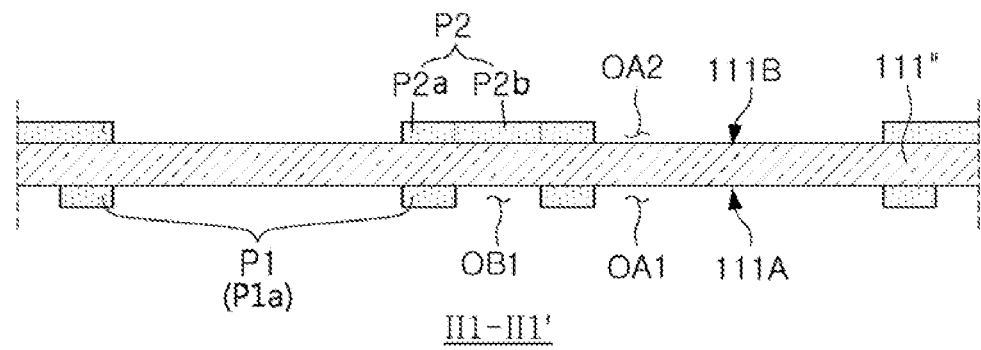
FIGS. 4B, 5B, 6B, and 7B are cross-sectional views of the metal frame (or a frame array) of FIGS. 4A, 5A, 6A, and 7A, respectively, along section II1-II1'.
Figure 4C:
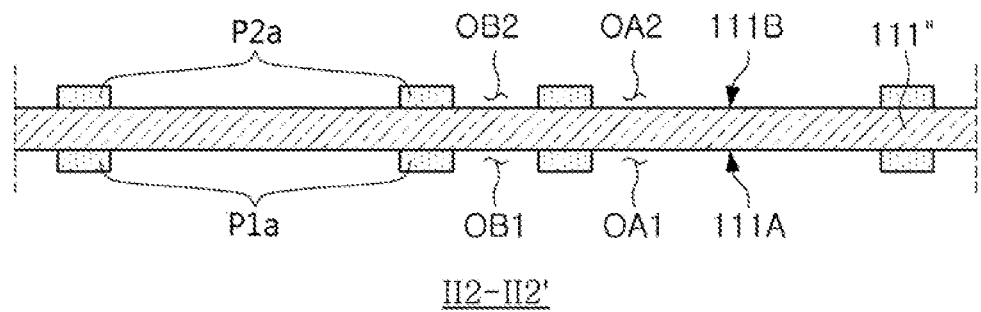
FIGS. 4C, 5C, 6C, and 7C are cross-sectional views of the metal frame (or the frame array) of FIGS. 4A, 5A, 6A, and 7A, respectively, along section II2-II2'.

Referring to FIGS. 4A, 4B, and 4C, a metal plate 111" having a first surface 111A and a second surface 111B, located opposite to each other, may be provided, and first and second mask patterns P1 and P2 may be formed on the first surface 111A and the second surface 111B of the metal plate 111".

The metal plate 111" may be a plate of a metal or alloy material that provides a plurality of metal frames (111 in FIG. 1). In an example embodiment, the metal plate 111" may include metal such as copper (Cu) or a Fe—Ni alloy.

The first and second mask patterns P1 and P2 employed in the present example embodiment may be configured to provide a complete removal (penetration) by double-sided etching or a partial removal by single-sided etching.

In the present example embodiment, the first and second mask patterns P1 and P2 have a plurality of frame regions P1a and P1b defining the shape of the metal frame (111 of FIG. 1) in plan view. The frame regions P1a and P1b of the first and second mask patterns P1 and P2 are disposed in regions overlapping each other. As illustrated in FIGS. 4A-4C, the plurality of frame regions P1a and P1b may have first openings OA1 and OA2 corresponding to the through-hole (110H in FIG. 1), respectively, and the plurality of frame regions P1a, P1b) may be disposed to have a constant distance from each other. Due to the distance, the first and second mask patterns P1 and P2 have second openings OB1, OB2.

In the present example embodiment, a second lower opening OB1 may be disposed between two adjacent frame regions P1a, and a second upper opening OB2 may be surrounded by two adjacent frame regions P1a and two adjacent connection region P2a. The second opening OB1 of the second mask pattern P2 may have a plurality of openings separated by a connection region P2b connecting the two adjacent frame regions P2a, while the second opening OB1 of the first mask pattern P1 may have one opening without a connection region. In the present example embodiment, a connection region P2b may be configured such an adjacent frame region P2a is connected by three connection regions P2b, respectively.

As described above, a region for forming the through-hole (110H in FIG. 1) through the first openings OA1 and OA2 may be exposed on the first and second surfaces 111A and 111B, while in a spacing region of the frame regions P1a and P2a exposed through the second opening, first and second surfaces 111A and 111B may be provided differently by the connection region P2b disposed only on the second surface 111B. Thus, in the second opening OB1 of the first surface 111A, all the spacing regions may be exposed, while in the second opening OB2 of the second surface 111B, only the spacing regions excluding the connection region P2b may be exposed.

The first mask pattern P1 and the second mask pattern P2 may be changed. For example, in an example embodiment, the first mask pattern P1 may include a connection region, and the second mask pattern P2 may not include a connection region. In addition, the connection region P2b may have various other arrangements (see FIGS. 9 and 10).

Figure 5A:
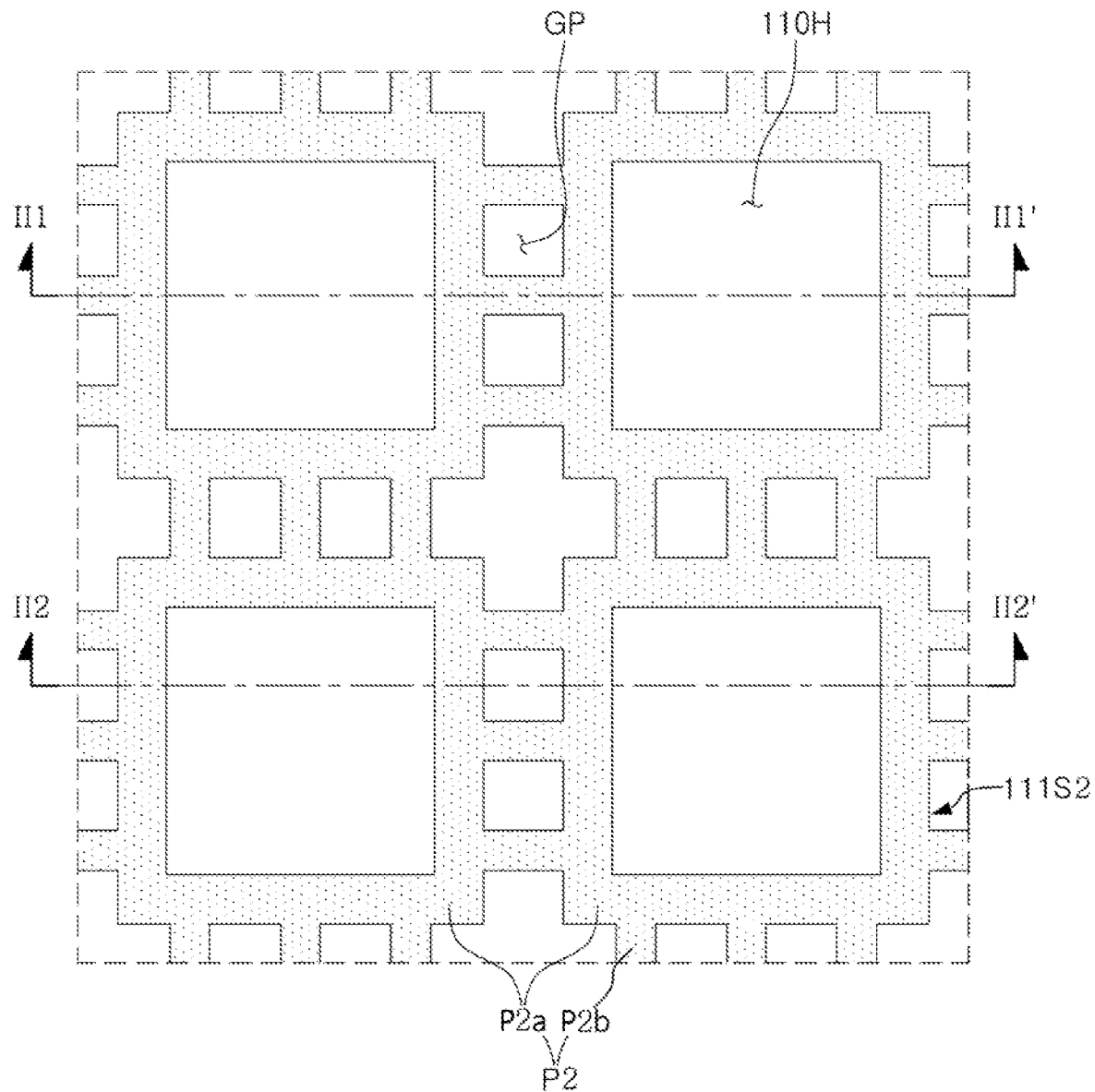
Figure 5B:
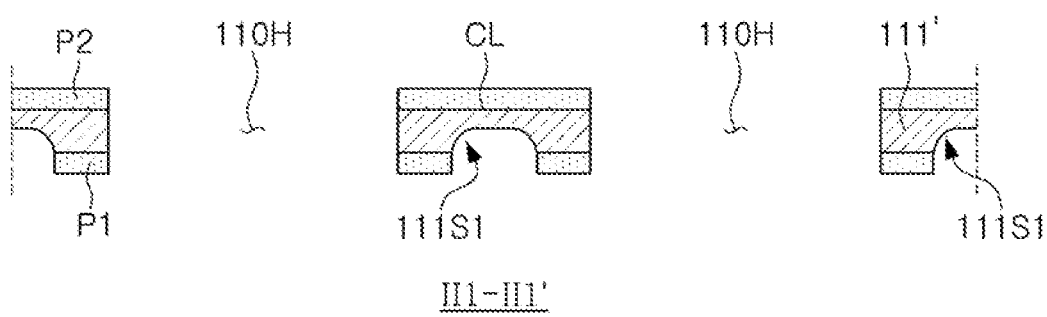
Figure 5C:
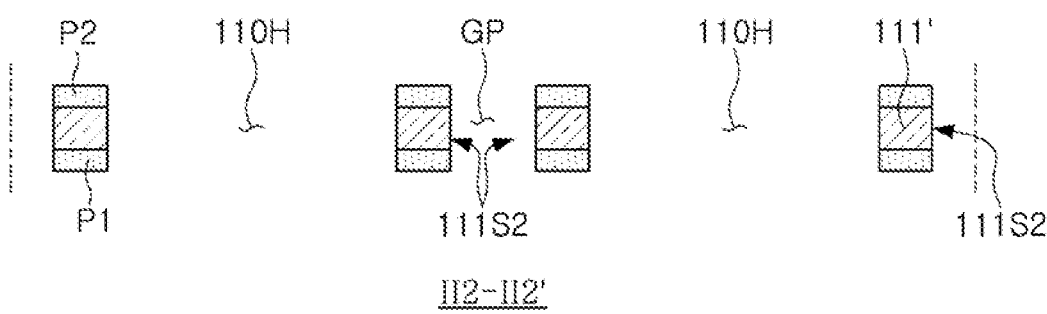

Next, referring to FIGS. 5A, 5B, and 5C, the metal plate 111" may be selectively etched using the first and second mask patterns P1 and P2 to form a frame array 111' including a plurality of metal frames 111 that are connected by connection lines CL.

For example, a separation region GP between the through-hole 110H and the individual metal frame 111 may be formed in the metal plate 111" by an etching process. The through-hole 110H may be formed by etching the region exposed through the first openings OA1 and OA2 in both surfaces (that is, the first and second surfaces 111A and 111B). The frame array 111' thus obtained may include a plurality of metal frames 111 that are connected by connection lines CL.

The separation region GP may be formed by etching a region exposed through the second openings OB1 and OB2 on the first and second surfaces 111A and 111B. In an etching process for the separation region GP, a portion corresponding to the connection region P2b of the second mask pattern P2 may be etched on the first surface 111A, while the portion may not be etched by the connection region P2b on the second surface 111B.

As a result, as illustrated in FIGS. 5A and 5B, the portion corresponding to the connection region P2b may have a region that is partially etched from the first surface after the etching process and allowed to remain (for example, as a connection line CL). As shown in FIGS. 5A and 5C, a portion corresponding to the second opening OB1 of the first mask pattern P1 may form a separation region GP that is double-sided etched to be penetrated, similar to the through-hole 110H.

As described above, the through-hole 110H and the separation region GP may be formed using double-sided etching using the first and second mask patterns P1 and P2 illustrated in FIGS. 4A to 4B, the first mask pattern P1 may additionally employ a connection region P2b, and a portion corresponding to the connection region P2b may for a connection line CL through partial removal by single-sided (for example, first surface 111A)) etching.

The etching process may be performed, for example, by wet etching. In order to form the connection line CL by partial etching, in addition to the configuration of the first and second mask patterns P1 and P2, etching process conditions may be controlled. In an example embodiment, the etching process conditions may be set such that the depth of single-sided etching is greater than half the thickness of the metal plate 111" and less than the total thickness of the metal plate 111" (for example, about 80% or less).

Referring to FIG. 5B, a lower side surface 111S1 of the connection line CL may have an arch-shaped curved surface. In the individual semiconductor package obtained by the subsequent cutting process (see FIG. 8D), an arc-shaped connection line CL may provide a protruding portion (110E in FIG. 8D), and an arc-shaped curved surface may provide a lower surface that is a concave curved surface of the protruding portion. The side surface 111S1 of the metal frame 111 obtained by the separation region GP may have a relatively vertical surface as shown in FIG. 5C even though it may have a somewhat irregular surface according to etching process conditions.

Figure 6A:
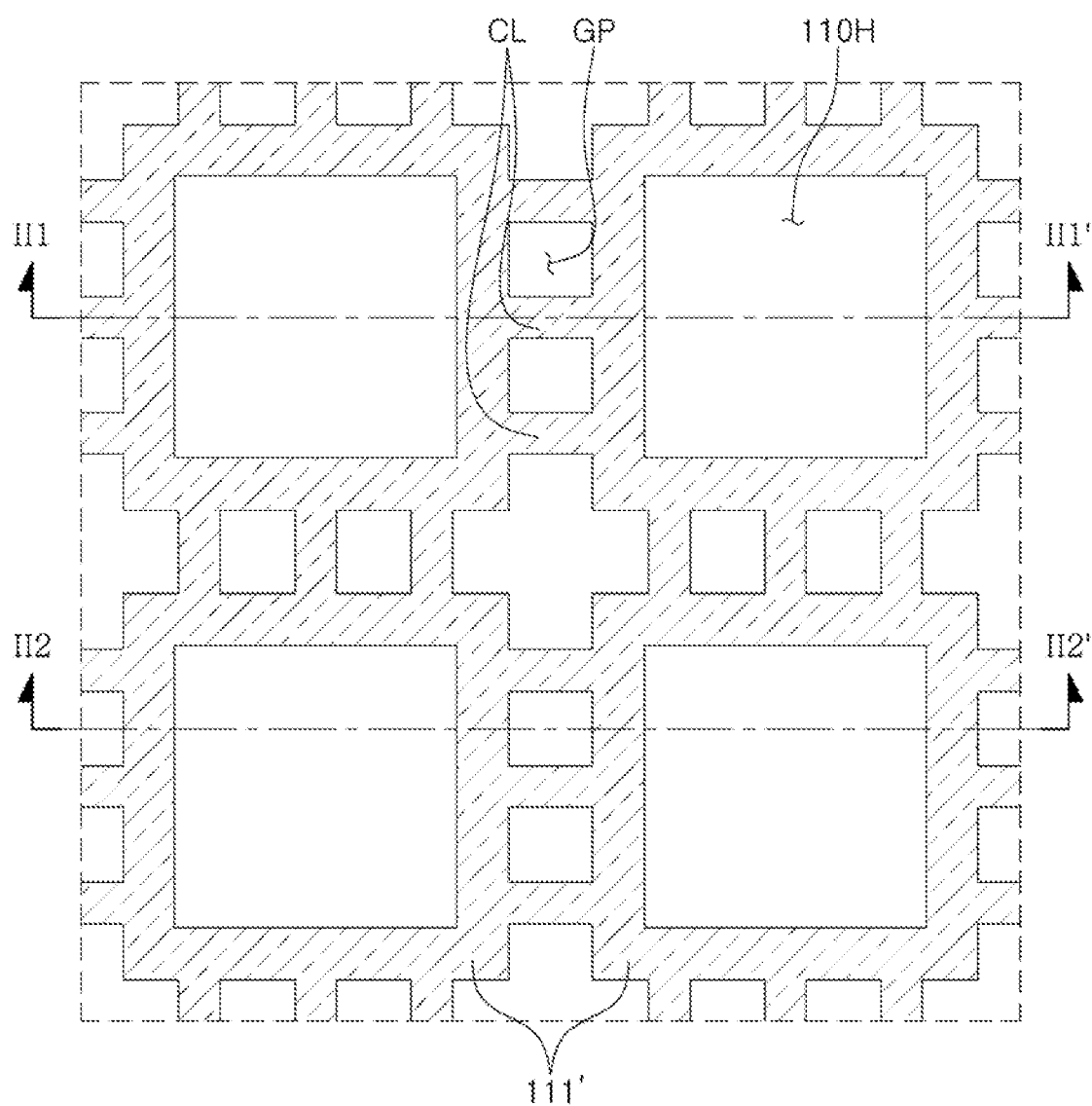
Figure 6B:
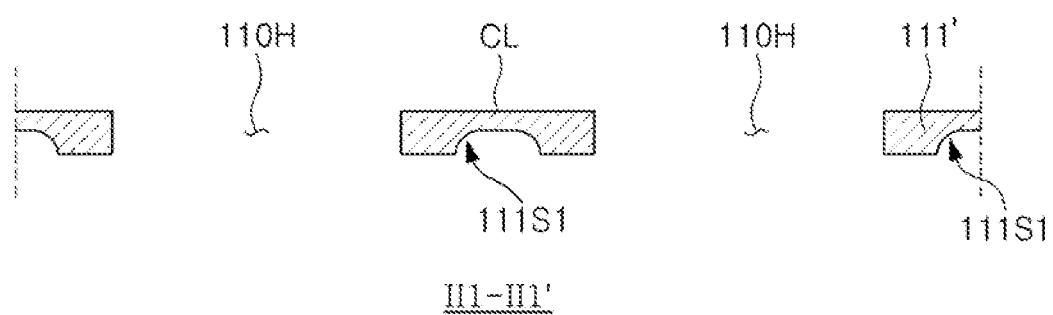
Figure 6C:
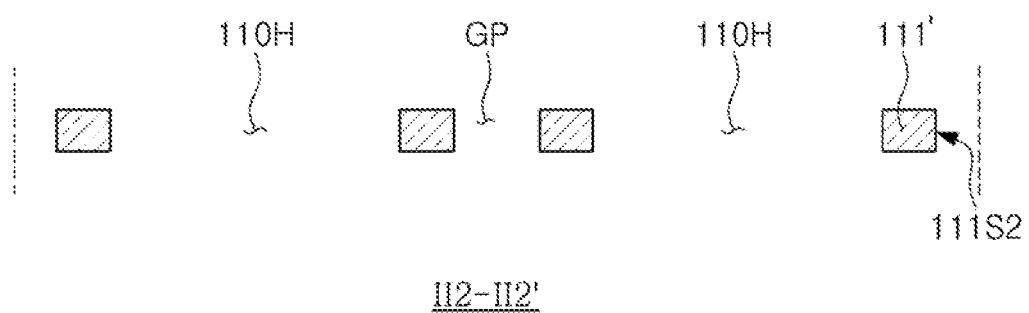

Next, referring to FIGS. 6A, 6B, and 6C, the first and second mask patterns P1 and P2 may be removed to provide a plurality of metal frames 111 connected by connection lines CL.

Each of the plurality of metal frames 111 may have a through-hole 110H, and may be separated into individual units by a separation region GP. The connection line CL located in the separation region GP may be formed to have a relatively thin thickness. Thus, in a subsequent cutting process (see FIG. 8D), it may be easy to perform cutting while minimizing deformation of the metal frame 111.

Figure 7A:
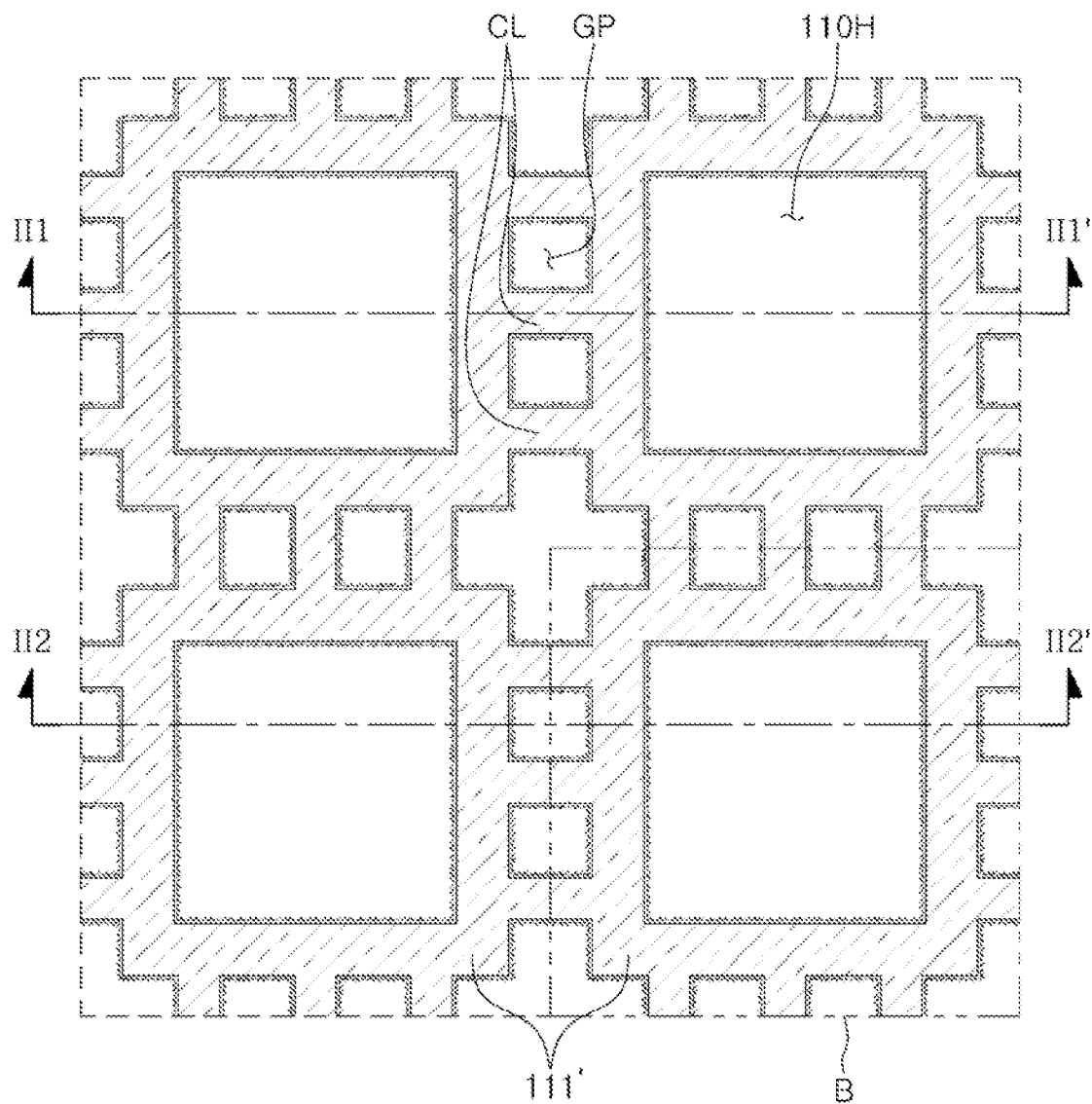
Figure 7B:
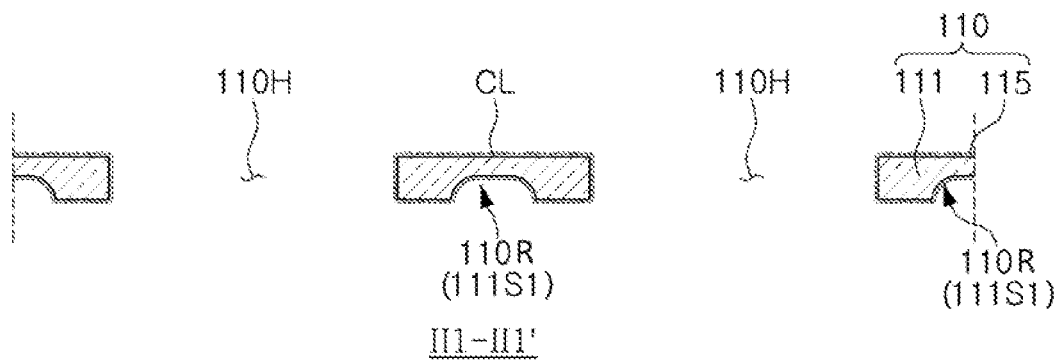
Figure 7C:
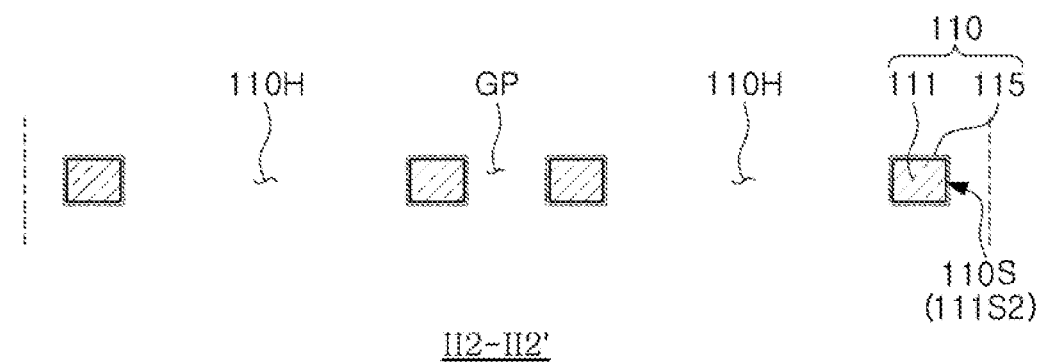

Next, referring to FIGS. 7A, 7B, and 7C, a plating layer 115 having a predetermined surface roughness may be formed on a surface of the metal frames 111. Thus, in a subsequent process (see FIG. 8D), it may be possible to ensure that the encapsulant 130 has with high adhesion to the metal frames 111.

FIGS. 8A to 8D are cross-sectional views of stages in a method of manufacturing a semiconductor package according to an example embodiment. The manufacturing processes of the semiconductor package shown in FIGS. 8A to 8D are processes using a frame array 111' mutually supported by connection lines CL shown in FIGS. 7A, 7B, and 7C, respectively, as may be understood with reference to the section I2-I2' of region "B" in FIG. 7A.

Figure 8A:
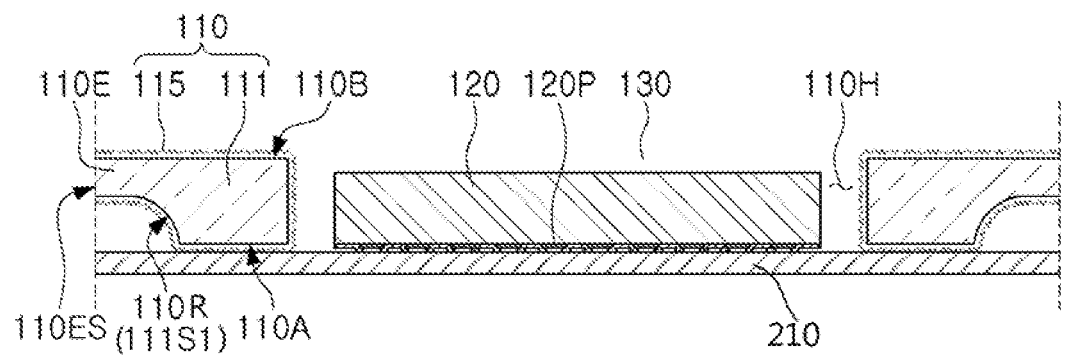
FIGS. 8A to 8D are cross-sectional views of stages in a method of manufacturing a semiconductor package according to an example embodiment.

Referring to FIG. 8A, the first surface 110A of the core member 110 may be attached to a first adhesive support film 210, and the semiconductor chip 120 may be disposed in the through-hole 110H of the core member 110.

Referring to FIG. 8A, the first surface 110A of the core member 110 may be attached to a first adhesive support film 210, and the semiconductor chip 120 may be disposed in the through-hole 110H of the core member 110. In an example embodiment, the first adhesive support film 210 may include a thermosetting adhesive tape or an ultraviolet curable adhesive tape. The semiconductor chip 120 may be attached to a region of the first adhesive support film 210 in the through-hole 110H. The semiconductor chip 120 may be disposed in a face-down manner such that the active surface (on which the contact pad 120P is disposed) is facing and attached to the first adhesive support film 210.

Figure 8B:
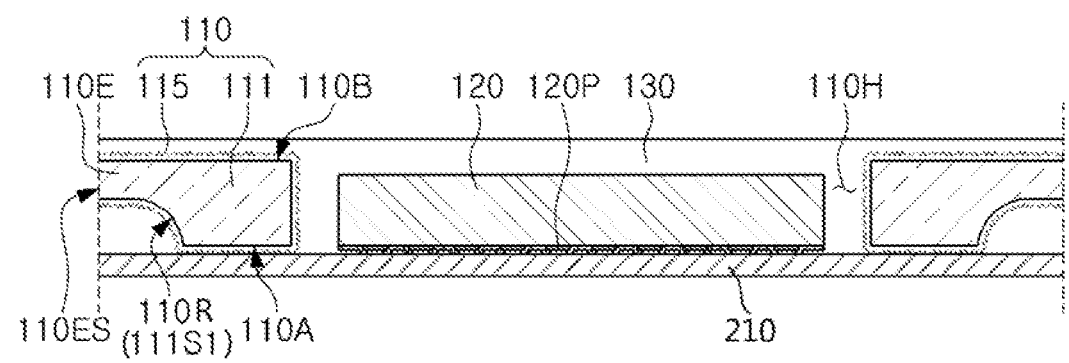

Next, referring to FIG. 8B, the semiconductor chip 120 may be encapsulated using the encapsulant 130.

The encapsulant 130 may be disposed to encapsulate the semiconductor chip 120 disposed in the through-hole 110H. In the present example embodiment, the encapsulant 130 may cover the second surface 110B of the core member 110 and the inactive surface of the semiconductor chip 120, and may fill at least a portion of a space in the through-hole 110H. The encapsulant 130 may be formed by a suitable method, for example, by laminating a precursor of the encapsulant 130 and then curing it. In an example embodiment, a liquid resin for the encapsulant 130 may be applied and then cured so as to encapsulate the semiconductor chip 120 on the first adhesive support film 210, such that the encapsulant 130 is formed.

The encapsulant 130 formed in the present process may be applied on the plating layer 115 of the core member 110, which has a rough surface. Thus, it may be possible to enhance adhesion between the encapsulant 130 and the core member 110. A surface roughness (Ra) of the plating layer 115 may be, for example, 0.5 μm or more. The core member 110 and the encapsulant 130 may be formed of heterogeneous materials. The surface roughness of the core member 110 may effectively reduce peeling due to a difference in coefficients of thermal expansion. In an example embodiment, the peel strength of the core member 110 and the encapsulant 130 may be 0.4 kgf/cm or more.

Figure 8C:
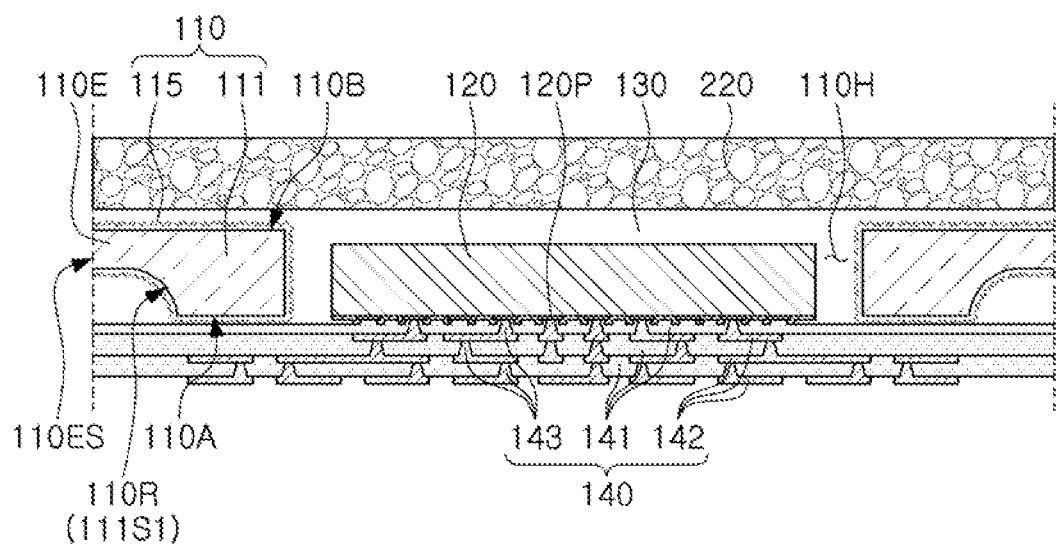

Next, referring to FIG. 8C, after attaching a second adhesive support film 220 to the upper surface of the encapsulant 130, and removing the first adhesive support film 210, a redistribution substrate 140 may be formed.

The second adhesive support film 220 may be the same as or similar to the first adhesive support film 210. Removal of the first adhesive support film 210 may be performed by peeling after the adhesive strength is weakened by using heat treatment or irradiating ultraviolet radiation, depending on the types.

The redistribution substrate 140 having redistribution layers 142 may be formed on a first surface 110A of a core member 110 from which the second adhesive support film 210 is removed and an active surface of a semiconductor chip 120. An insulating member 141 may be formed on the first surface 110A of the core member 110 and the active surface of the semiconductor chip 120, an opening in which at least a portion of the contact pad 120P (or a redistribution layer 142) is exposed on the insulating member 141, and may be performed by repeating a process of forming the redistribution layers 142 for a desired number of layers. In an example embodiment, the insulating member 141 may include a thermosetting resin such as an epoxy resin, and a thermoplastic resin such as polyimide. In a specific example, the insulating member 141 may include an Ajinomoto Build-up Film (ABF), FR-4, BT, or a photosensitive dielectric (PID). The redistribution layers 142 and redistribution vias 143 may be formed by forming a seed layer and then forming a plating material layer such as Cu on the seed layer.

Figure 8D:
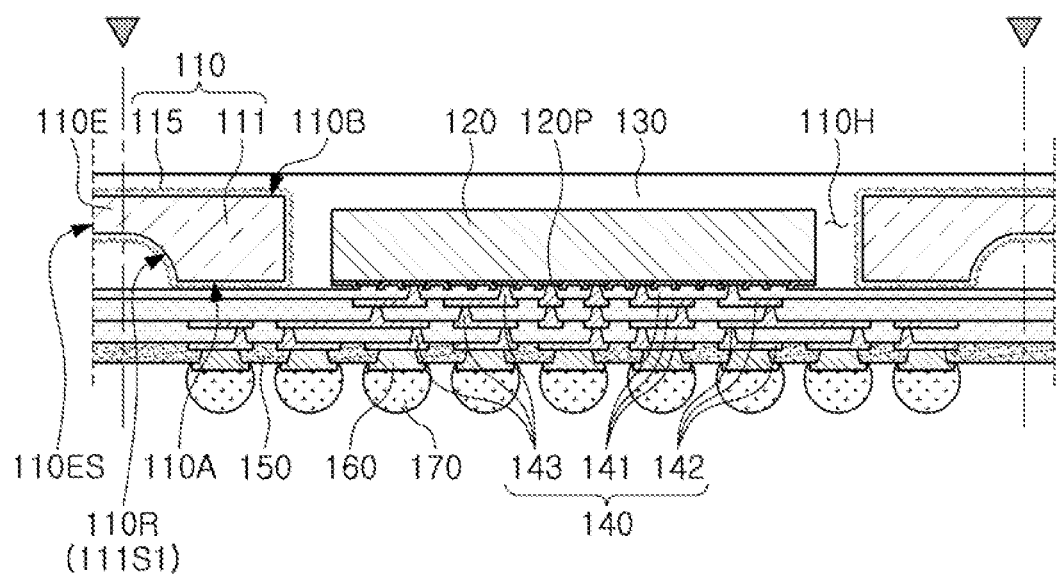

Next, referring to FIG. 8D, a passivation layer 150 may be formed on the lower surface of the redistribution substrate 140, and a process of forming an underbump metal (UBM) layer 160 and an electrical connection metal 170 connected to the redistribution layers 142, and cutting them into individual semiconductor packages may be performed.

The passivation layer 150 may be formed by laminating a precursor and then curing it, or by applying a liquid resin and then curing it. In the passivation layer 150, an opening exposing a portion of an outermost redistribution layer 142 may be formed. The UBM layer 160 may be formed using a metallization method so as to be connected to the exposed region, and the electrical connection metal 170 may be formed on the UBM layer 160. The above-described processes may be performed in a large-scale panel unit.

A singulation process, such as a sawing process, may be performed after the above-described process is completed. In the singulation process, the relatively thin connection lines CL may be cut to singulate the structure into a plurality of semiconductor packages 100. In the process of cutting the connection lines CL, a portion of the connection lines CL adjacent to the core member 110 may be allowed remain in consideration of a process margin so as not to damage the core member 110. The portions of the remaining connection lines CL may correspond to the protruding portions 110E, respectively. As described in the previous process (see FIG. 5B), the connection line CL providing the protruding portion 110E may be obtained by single-sided etching (i.e., etching with respect to the first surface 111A). Thus, the arc-shaped connection line CL may provide the protruding portion 110E.

An upper surface of the protruding portion 110E may have a flat surface extending from the second surface 110B of the core member 110. A lower surface of the protruding portion 110E may have a lower surface 110R that is recessed from the first surface 110A of the core member 110. The recessed lower surface 110R may have a concave curved surface. In addition, the exposed surface 110ES of the protruding portion 110E may be located on substantially the same plane as the side surface of the encapsulant 130 after the sawing process.

The semiconductor package according to the present example embodiment may be implemented in various forms. In an example embodiment, the manufacturing process of the metal frame 111 and the arrangement of the protruding portion 110E of the core member 110 may be variously changed.

Figure 9:
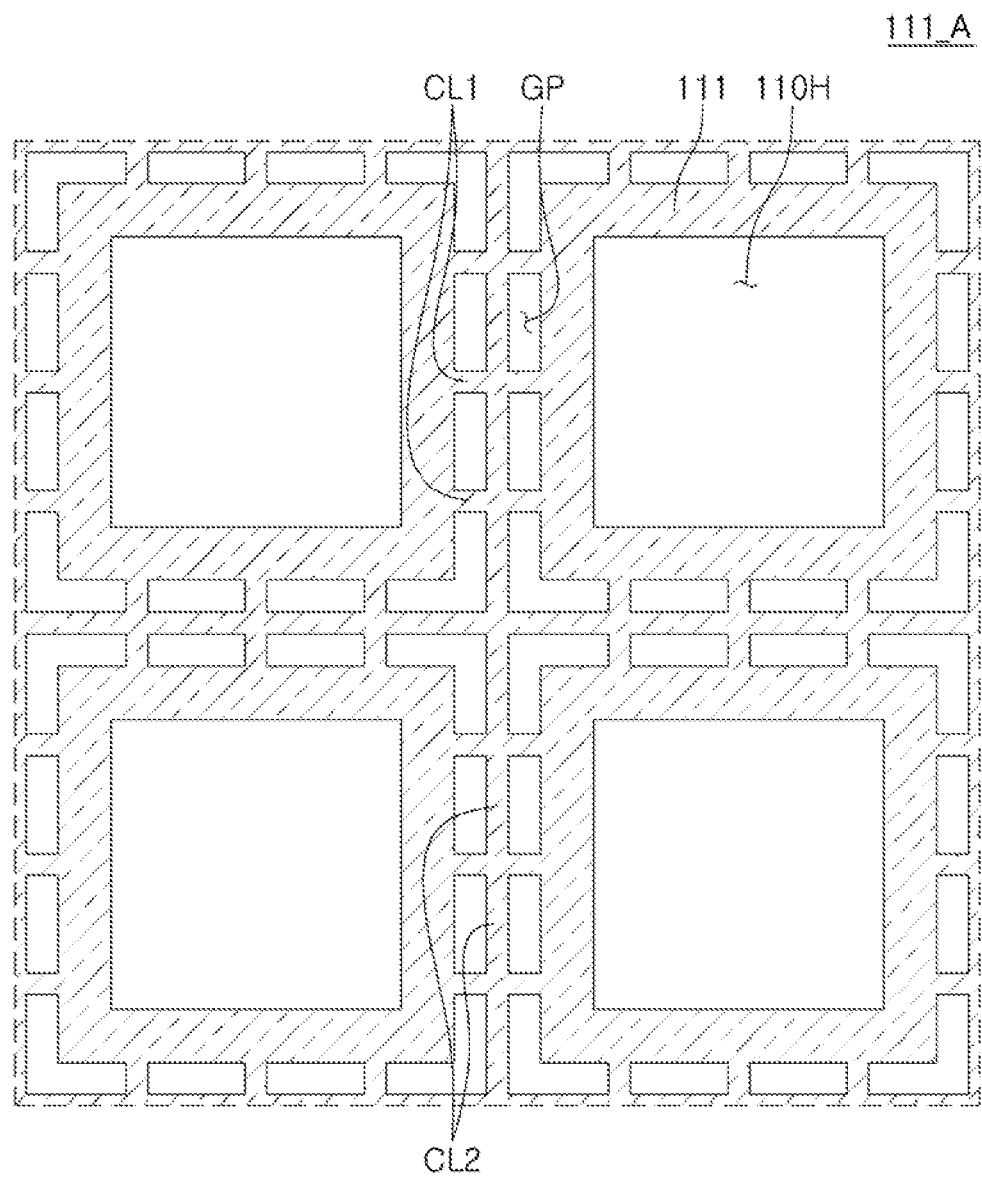
FIG. 9 is a plan view illustrating a frame array that may be employed in a semiconductor package according to an example embodiment.

FIG. 9 is a plan view illustrating a frame array that may be employed in a semiconductor package according to an example embodiment.

The semiconductor package illustrated in FIG. 9 may be understood to be similar to the structure illustrated in FIG. 6A, except that a frame array 111_A according to the present example embodiment has a structure with a plurality of intersecting connection lines. Descriptions of the components of the present example embodiment may refer to descriptions of the same or similar components of the frame array 111' shown in FIG. 6A, unless otherwise stated.

The frame array 111_A according to the present example embodiment may include a plurality of metal frames 111, and may include first connection lines CL1 connecting the plurality of metal frames 111 and second connection lines CL2 connecting the first connection lines CL1.

The first connection line CL1 may be configured such that adjacent metal frames 111 are connected by a plurality of (for example, three) first connection lines CL1, similar to the connection line CL of the previous example embodiments. Further, the second connection line CL2 may be arranged to intersect the first connection line CL1 along the separation region GP.

In addition, the second connection line CL2 may define a cutting line used in a singulation process. The second connection line CL2 may be removed in the cutting process. Thus, as shown in FIG. 3, an external side surface of a final semiconductor package may have a shape in which three protruding portions 110E are exposed to the side surface of the encapsulant 130, respectively.

Figure 10:
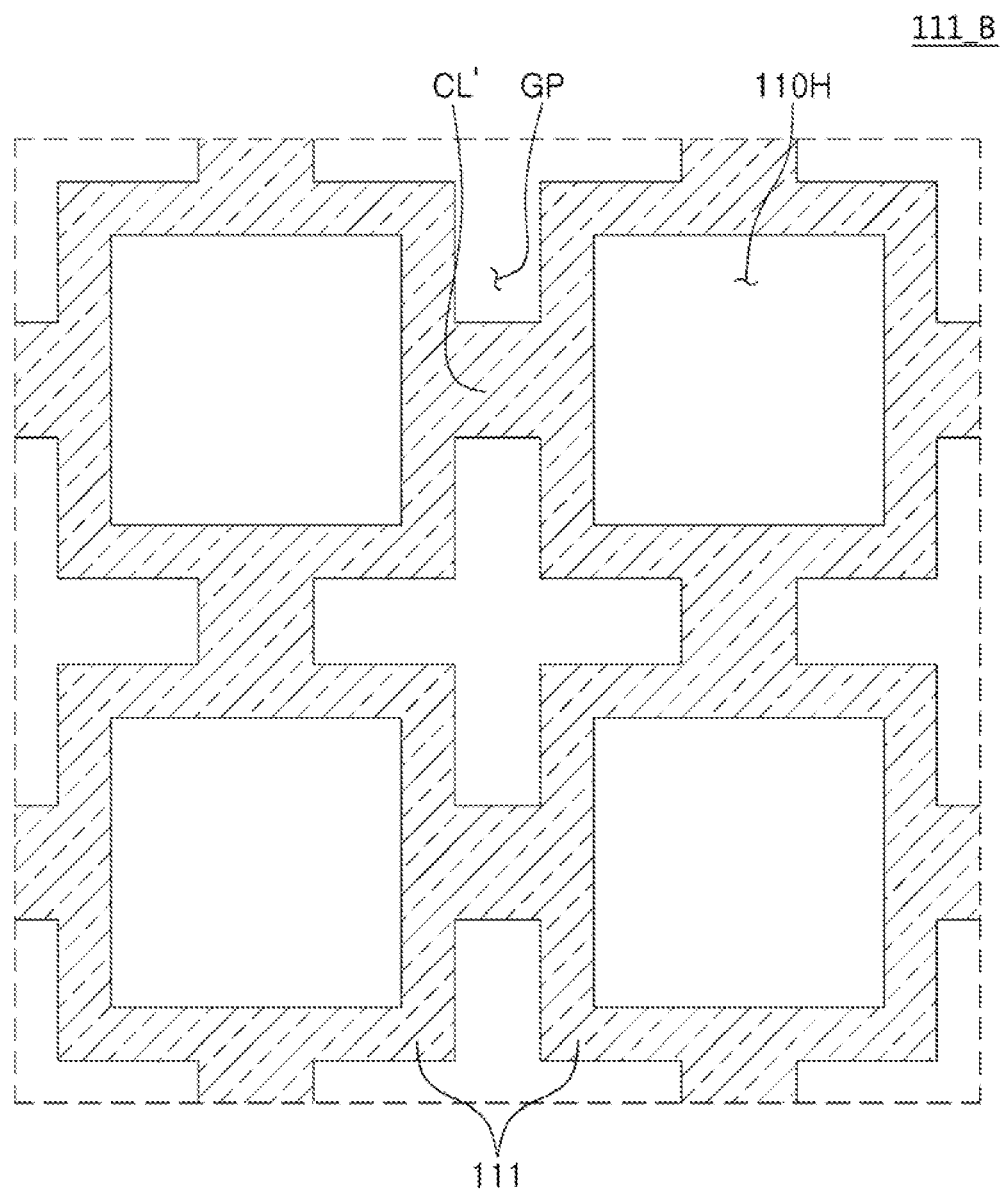
FIG. 10 is a plan view illustrating a frame array that may be employed in a semiconductor package according to an embodiment.

FIG. 10 is a plan view illustrating a frame array that may be employed in a semiconductor package according to an example embodiment.

Referring to FIG. 10, a frame array 111_B according to the present example embodiment may be understood as being similar to the structure illustrated in FIG. 6A, except for two adjacent metal frames being connected by one (single) connection line CL'. Descriptions of the components of the present example embodiment may refer to descriptions of the same or similar components of the frame array 111' shown in FIG. 6A, unless stated otherwise.

The frame array 111_B according to the present example embodiment may have a plurality of metal frames 111 and a connection line CL' connecting the plurality of metal frames 111, similar to the example embodiment illustrated in FIGS. 1 to 3. However, the connection line CL' employed in the present example embodiment may be configured such that an adjacent metal frame 111 is connected by one connection line CL'. For example, a single connection line CL' may be located generally in the center of the adjacent metal frame 111. In addition, for stable support, the connection line CL' may have a larger width than other example embodiments having multiple connection lines.

Figure 11:
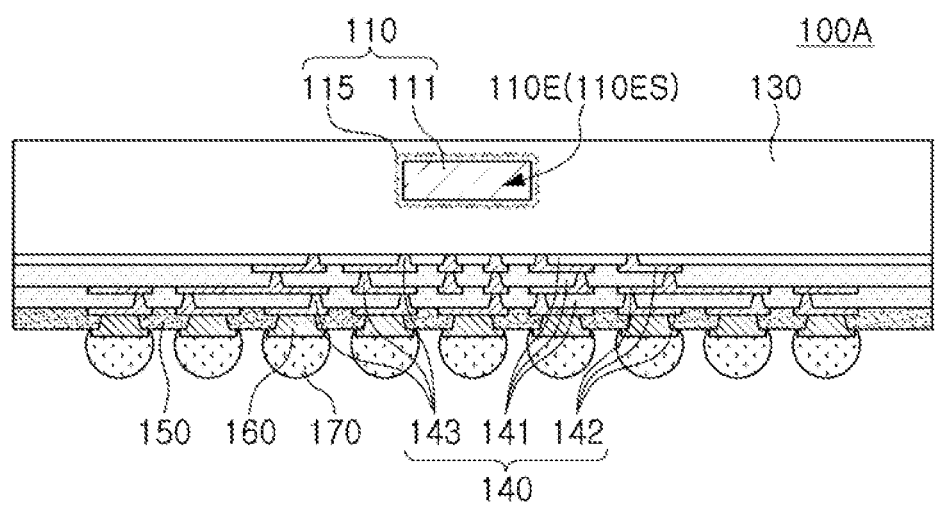
FIG. 11 is an external side surface view illustrating the semiconductor package of FIG. 10.

FIG. 11 is an external side view illustrating the semiconductor package of FIG. 10, and may be understood as a side surface view corresponding to the external side view shown in FIG. 3.

Referring to FIG. 11, a semiconductor package 100A according to the present example embodiment may have a rectangular shape having right angles from a plan view, and the core member 110 may have four external side surfaces 110S. The protruding portion 110E in the present example embodiment may be disposed in a number of one on each of the four external side surfaces 110S, as shown in FIG. 11.

As described above, the protruding portion 110E may be disposed in various numbers on respective external side surfaces 110S.

In another example embodiment, the protruding portion may be arranged in different numbers on the external side surfaces, respectively. For example, in the case of having a rectangular shape in plan view of the semiconductor package, the number of protruding portions disposed on the external side surface of a long side may be greater than the number of protruding portions disposed on the external side surface of a short side. In another example embodiment, some surfaces may not have protruding portions on the external side surface. For example, in the case of a semiconductor package manufactured from a metal frame positioned at an edge in a frame array, a protruding portion may not be disposed on an external side surface corresponding to the edge.

Figure 12A:
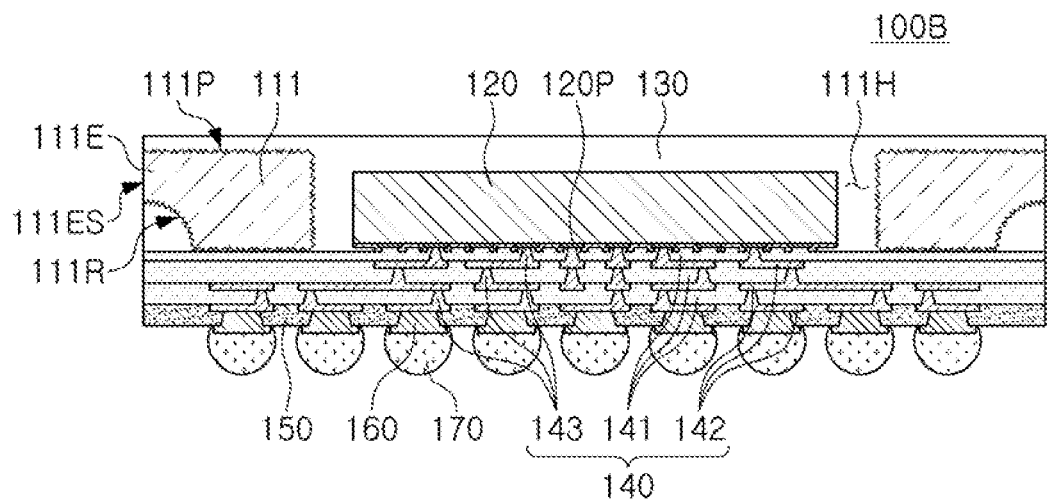
FIGS. 12A to 12B are side cross-sectional views illustrating a semiconductor package according to an example embodiment, respectively.
Figure 12B:
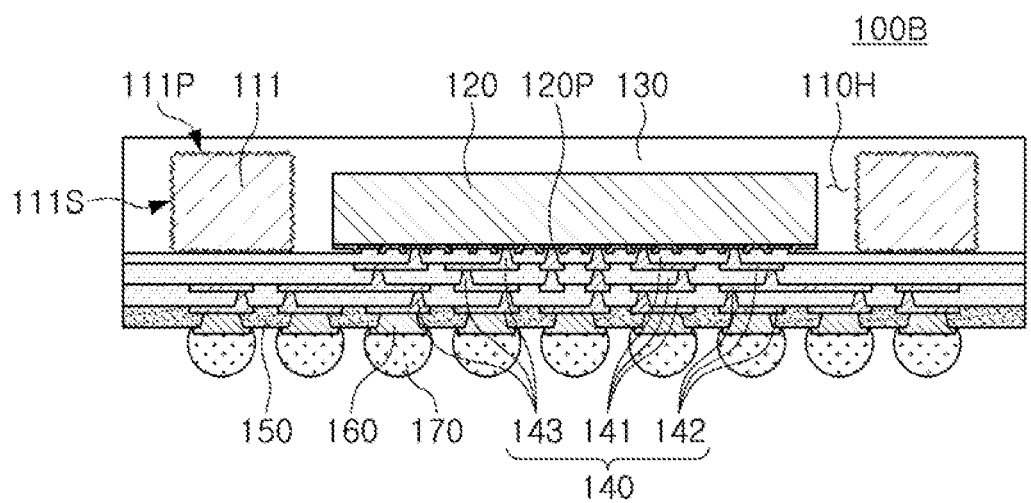

FIGS. 12A to 12B are cross-sectional side views illustrating a semiconductor package according to an example embodiment, respectively.

Referring to FIGS. 12A and 12B, it may be understood that a semiconductor package 100B according to the present example embodiment is similar to the structure shown in FIGS. 1 to 3, except that the surface roughness is directly applied to the surface of the metal frame. Descriptions of the components of the present example embodiment may refer to descriptions of the same or similar components of the semiconductor package 100 illustrated in FIGS. 1 to 3, unless otherwise specified.

The semiconductor package 100B according to the present example embodiment may include a metal frame 111 having a through-hole 110H. The metal frame 111 may have a protruding portion 111E having a surface exposed on the side surface of the encapsulant 130, similar to the example embodiment illustrated in FIG. 2A. The protruding portion 111E may have a flat upper surface, as the upper surface of the metal frame 111, while a lower surface 111R of the protruding portion 111E may have a recessed concave curved surface.

The metal frame 111 employed in the present example embodiment does not have a separate plating layer as a core member, and may be formed to have an uneven surface 111P to impart a predetermined surface roughness to the surface of the metal frame 111 itself. In an example embodiment, the surface roughness (Ra) of the uneven surface 111P may be 0.5 μm or more.

The rough surface of the metal frame 111 and the encapsulant 130 may be heterogeneous materials, and may effectively reduce the peeling problem due to a difference in a coefficient thermal expansion. In an example embodiment, the peel strength of the metal frame 111 and the encapsulant 130 may be 0.4 kgf/cm or more.

By way of summation and review, in order to improve the rigidity of a semiconductor package, a separate structure (for example, a printed circuit board) may be embedded inside the package. However, a manufacturing process and cost may increase. Further, fine foreign matter may be generated in a process of processing the separate structure, which may result in a lower yield of the package.

As described above, a semiconductor package according to an example embodiment may include a core member formed by processing a single metal frame and a vertical connection conductor. The semiconductor package may exhibit excellent rigidity, and improved warpage characteristics and heat dissipation characteristics may be provided.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor package, comprising:
a core member having a first surface and a second surface opposing each other, and an external side surface between the first and second surfaces, the core member having a through-hole connecting the first and second surfaces, having a protruding portion that protrudes from the external side surface, and having a surface roughness (Ra) of 0.5 μm or more;
a redistribution substrate on the first surface of the core member, and including a redistribution layer;
a semiconductor chip in the through-hole on the redistribution substrate, and having a contact pad electrically connected to the redistribution layer; and
an encapsulant on the redistribution substrate, and covering the semiconductor chip and the core member, the protruding portion of the core member having a surface exposed to a side surface of the encapsulant.

2. The semiconductor package as claimed in claim 1, wherein the exposed surface of the protruding portion is substantially coplanar with the side surface of the encapsulant.

3. The semiconductor package as claimed in claim 1, wherein the external side surface of the core member includes four external side surfaces, and
the protruding portion includes a plurality of protruding portions, one or more thereof being provided on each of the four external side surfaces.

4. The semiconductor package as claimed in claim 3, wherein the plurality of protruding portions are provided in a number of two or more at an interval on each of the four external side surfaces.

5. The semiconductor package as claimed in claim 1, wherein the protruding portion has a flat upper surface extending from the second surface of the core member, and a lower surface of the core member has a surface that is recessed from the first surface.

6. The semiconductor package as claimed in claim 5, wherein a lower surface of the protruding portion has a concave curved surface.

7. The semiconductor package as claimed in claim 1, wherein the core member includes a metal frame and a plating layer that is on surfaces of the metal frame except for the exposed surface of the protruding portion, and the surface roughness is provided by the plating layer.

8. The semiconductor package as claimed in claim 7, wherein the metal frame includes a Fe—Ni alloy, and the plating layer includes a copper plating layer.

9. The semiconductor package as claimed in claim 1, wherein a thickness of the core member is greater than a thickness of the semiconductor chip.

10. A semiconductor package, comprising:
a redistribution substrate including a redistribution layer;
a semiconductor chip on an upper surface of the redistribution substrate, and having a contact pad electrically connected to the redistribution layer;
a core member on the redistribution substrate, the core member having a protruding portion that protrudes from an external side surface of the core member in a direction parallel to the upper surface of the substrate and having a through-hole accommodating the semiconductor chip, wherein an area defined by the external side surface is smaller than an area of the redistribution substrate; and
an encapsulant on the redistribution substrate, covering the semiconductor chip and the core member, and having a side surface to which a surface of the protruding portion is exposed.

11. The semiconductor package as claimed in claim 10, wherein the exposed surface of the protruding portion is substantially coplanar with the side surface of the encapsulant.

12. The semiconductor package as claimed in claim 10, wherein the core member includes:
a metal frame having the protruding portion, and
a plating layer on a surface of the metal frame and having a surface roughness (Ra) of 0.5 μm or more.

13. The semiconductor package as claimed in claim 12, wherein the plating layer is on an entire surface of the metal frame except for the exposed surface.

14. The semiconductor package as claimed in claim 12, wherein the core member and the encapsulant have peel strength of 0.4 kgf/cm or more.

15. The semiconductor package as claimed in claim 10, wherein:
the external side surface of the core member has a plurality of external side surfaces, and
the protruding portion includes a plurality of protruding portions provided in a number of one or more on each of the plurality of external side surfaces.

16. The semiconductor package as claimed in claim 15, wherein the plurality of protruding portions each have an upper surface extending from the upper surface of the core member to be flat.

17. The semiconductor package as claimed in claim 15, wherein lower surfaces of the plurality of protruding portions have a curved surface recessed from the lower surface of the core member, respectively.

18. A semiconductor package, comprising:
a redistribution substrate having a first surface and a second surface opposing each other, and including an insulating member and a redistribution layer on the insulating member, the redistribution layer having a plurality of redistribution patterns that are respectively disposed on a plurality of levels of the insulating member, and having a plurality of redistribution vias that are respectively connected to the plurality of redistribution patterns;
a core member on the first surface of the redistribution substrate, the core member having a metal frame that includes a through-hole and an external side surface that has a protruding portion, and having a plating layer having a surface roughness (Ra) of 0.5 μm or more on a surface of the metal frame, an area of the core member surrounded by the external side surface of the core member being smaller than an area of the redistribution substrate;
a semiconductor chip on the first surface of the redistribution substrate in the through-hole, and having a contact pad electrically connected to the redistribution layer by a redistribution via, adjacent to the first surface of the redistribution substrate;
an encapsulant on the first surface of the redistribution substrate, covering the semiconductor chip and the core member, the encapsulant including an insulating resin that is different from the insulating resin of the insulating member, and having a side surface to which a surface of the protruding portion is exposed; and
an underbump metal on the second surface of the redistribution substrate, and electrically connected to the redistribution layer,
wherein the protruding portion has an upper surface extending from the upper surface of the core member to be flat and a lower surface recessed from the lower surface of the core member.

19. The semiconductor package as claimed in claim 18, wherein the core member and the encapsulant have peel strength of 0.4 kgf/cm or more.

20. The semiconductor package as claimed in claim 18, wherein the exposed surface of the protruding portion is substantially coplanar with the side surface of the encapsulant, and the plating layer is on the surface of the metal frame except for the exposed surface.

* * * * *